United States Patent
Takasu et al.

(10) Patent No.: US 9,865,470 B2
(45) Date of Patent: Jan. 9, 2018

(54) PROCESSING APPARATUS AND PROCESSING METHOD

(71) Applicant: Panasonic Corporation, Osaka (JP)

(72) Inventors: Yoshifumi Takasu, Osaka (JP); Nobuyuki Yokoyama, Osaka (JP); Isao Tashiro, Osaka (JP); Nobuyuki Kamikihara, Nara (JP)

(73) Assignee: Panasonic Corporation, Osaka (JP)

( * ) Notice: Subject to any disclaimer, the term of this patent is extended or adjusted under 35 U.S.C. 154(b) by 96 days.

(21) Appl. No.: 15/099,590

(22) Filed: Apr. 15, 2016

(65) Prior Publication Data

US 2016/0379838 A1 Dec. 29, 2016

(30) Foreign Application Priority Data

Jun. 29, 2015 (JP) .................. 2015-130235
Feb. 1, 2016 (JP) .................. 2016-017261

(51) Int. Cl.
| | |
|---|---|
| *B24B 21/12* | (2006.01) |
| *H01L 21/306* | (2006.01) |
| *B24B 37/04* | (2012.01) |
| *B24B 37/11* | (2012.01) |
| *H01L 21/687* | (2006.01) |
| *H01L 21/67* | (2006.01) |

(Continued)

(52) U.S. Cl.
CPC ........ *H01L 21/30625* (2013.01); *B24B 21/06* (2013.01); *B24B 21/12* (2013.01); *B24B 37/04* (2013.01); *B24B 37/11* (2013.01); *H01L 21/2686* (2013.01); *H01L 21/67115* (2013.01); *H01L 21/68785* (2013.01)

(58) Field of Classification Search
CPC ......... B24B 21/06; B24B 21/12; B24B 37/04; B24B 37/11; H04L 21/2686; H04L 21/30625; H04L 21/67115; H04L 21/68785
USPC ........................................ 451/41, 303, 307
See application file for complete search history.

(56) References Cited

U.S. PATENT DOCUMENTS 5,791,969 A * 8/1998 Lund ................... B24B 21/00
 451/289
5,820,446 A * 10/1998 Lu ........................ B24B 7/17
 451/302

(Continued)

FOREIGN PATENT DOCUMENTS

WO 2007/007683 1/2007
WO 2007/063873 6/2007

*Primary Examiner* — Eileen Morgan
(74) *Attorney, Agent, or Firm* — Panasonic IP Management; Kerry S. Culpepper

(57) ABSTRACT

A processing apparatus includes a rotary table that causes a workpiece to rotate around a rotary axis, a roller-shaped member that rotates on an axis orthogonal to the rotary axis of the rotary table, a vertical driving section that is driven in a direction of the rotary axis of the rotary table so as to bring the roller-shaped member and the workpiece into contact with each other, an ultraviolet ray irradiation source that irradiates a portion between the roller-shaped member and the workpiece with an ultraviolet ray, a polishing material that is supplied to the portion between the roller-shaped member and the workpiece, and a light scattering medium that is supplied to the portion between the roller-shaped member and the workpiece and scatters an ultraviolet ray from the ultraviolet ray irradiation source.

12 Claims, 5 Drawing Sheets

(51) Int. Cl.
*H01L 21/268* (2006.01)
*B24B 21/06* (2006.01)

(56) References Cited

U.S. PATENT DOCUMENTS

| | | | | |
|---|---|---|---|---|
| 7,140,203 B2* | 11/2006 | Saito | ................. | C03C 15/00 65/30.14 |
| 2009/0050897 A1* | 2/2009 | Watanabe | ............... | B24B 37/26 257/77 |
| 2009/0253353 A1* | 10/2009 | Ogawa | ................. | B24B 37/205 451/41 |
| 2013/0273813 A1* | 10/2013 | Prasad | ................. | B24B 37/205 451/6 |
| 2015/0125679 A1* | 5/2015 | Ishikawa | ............... | C23C 16/402 428/216 |

\* cited by examiner

US 9,865,470 B2

PROCESSING APPARATUS AND PROCESSING METHOD

CROSS-REFERENCE TO RELATED APPLICATIONS

The present application claims the benefit of foreign priority to Japanese Patent Application No. 2015-130235 filed Jun. 29, 2015 and Japanese Patent Application No. 2016-17261 filed Feb. 1, 2016, the entire contents disclosed in the applications are incorporated herein by reference.

TECHNICAL FIELD

The technical field relates to a processing apparatus for processing a workpiece by using a polishing material.

BACKGROUND

Recently, as a processing apparatus for processing a device forming surface of a semiconductor wafer, a chemical mechanical polishing (CMP) apparatus having both a chemical operation and a mechanical operation has been adopted.

Meanwhile, a substrate formed from a hard brittle material such as sapphire, SiC, GaN, and diamond recently attracting attention as a next generation semiconductor substrate is chemically stable. Therefore, even though a general chemical mechanical polishing method is utilized, the chemical operation is extremely insignificant, compared to a case of using Si. Thus, a polishing rate becomes small.

One method of polishing a processing target substance while performing irradiation of an ultraviolet ray includes setting pressure of a processing atmosphere including oxygen to be higher than atmospheric pressure and adopting a slurry including particles of titania in a processing atmosphere (for example, refer to Pamphlet of International Publication No. 2007-063873 WO).

In addition, a polishing method has been proposed. In the method, a polishing surface plate formed from quartz and having lattice grooves on the external surface is adopted, solid photocatalyst particles are embedded in the lattice grooves, a polishing target surface of the substrate is pressed to the external surface of the polishing surface plate at high pressure, the polishing target surface of the substrate is irradiated with an ultraviolet ray which is transmitted through the polishing surface plate from the rear surface of the polishing surface plate, and the substrate is oscillated relatively with respect to the polishing surface plate while at least any one between the external surface of the polishing surface plate and the polishing target surface of the substrate is heated by performing irradiation of infrared light (for example, refer to Pamphlet of International Publication No. 2007-007683 WO).

SUMMARY

However, the method disclosed in Pamphlet of International Publication No. 2007-063873 WO uses an expensive photocatalyst. Accordingly, the cost of the apparatus becomes expensive. In addition, in the method disclosed in Pamphlet of International Publication No. 2007-007683 WO, quartz transmitting an ultraviolet ray has to be used as a polishing surface plate. Therefore, there is a problem in that it is difficult to process quartz and it is difficult to uniformly irradiate a processing target surface of a workpiece with an ultraviolet ray.

An object of the present disclosure is to provide a processing apparatus in which a processing target surface of a workpiece can be uniformly irradiated with an ultraviolet ray, uniform oxides can be generated, and the workpiece can be processed so as to have a smooth flat surface.

A processing apparatus disclosed herein includes a rotary table that causes a workpiece to rotate around a rotary axis, a roller-shaped member that rotates on an axis orthogonal to the rotary axis of the rotary table, a vertical driving section that is driven in a direction of the rotary axis of the rotary table so as to bring the roller-shaped member and the workpiece into contact with each other, an ultraviolet ray irradiation source that irradiates a portion between the roller-shaped member and the workpiece with an ultraviolet ray, a polishing material that is supplied to the portion between the roller-shaped member and the workpiece, and a light scattering medium that is supplied to the portion between the roller-shaped member and the workpiece and scatters an ultraviolet ray from the ultraviolet ray irradiation source.

According to the processing apparatus disclosed herein, it is possible to generate oxides on a processing target surface without using photocatalyst particles or a quartz surface plate, to uniformly irradiate the processing target surface with an ultraviolet ray, and to process the processing target surface so as to have a flat surface.

DETAILED DESCRIPTION OF PREFERRED EMBODIMENTS

Figure 1:
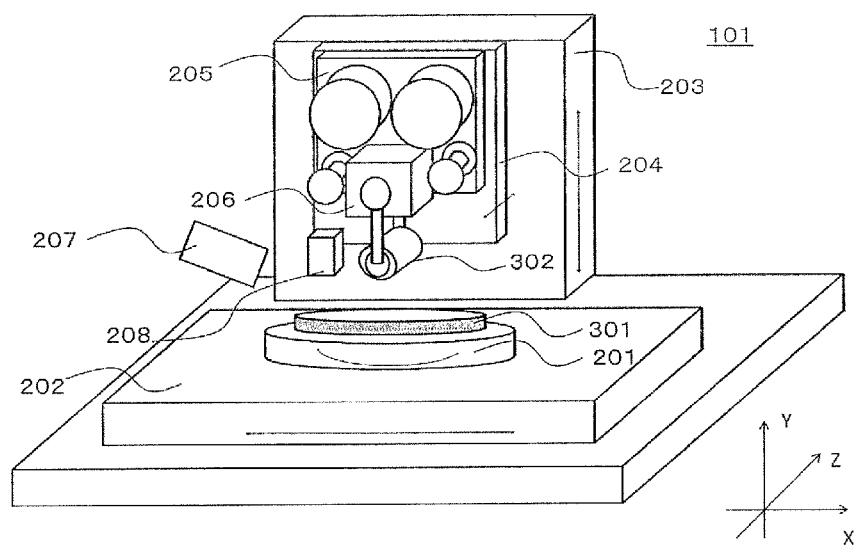
FIG. 1 is a schematic perspective view illustrating a configuration of a processing apparatus of Embodiment 1.

According to a first aspect, a processing apparatus includes a rotary table that causes a workpiece to rotate around a rotary axis, a roller-shaped member that rotates on an axis orthogonal to the rotary axis of the rotary table, a vertical driving section that is driven in a direction of the rotary axis of the rotary table so as to bring the roller-shaped member and the workpiece into contact with each other, an ultraviolet ray irradiation source that irradiates a portion between the roller-shaped member and the workpiece with an ultraviolet ray, a polishing material that is supplied to the portion between the roller-shaped member and the workpiece, and a light scattering medium that is supplied to the portion between the roller-shaped member and the workpiece and scatters an ultraviolet ray from the ultraviolet ray irradiation source.

According to a second aspect, in the processing apparatus of the first aspect, the polishing material may have a Vickers hardness higher than that of the workpiece, and the light scattering medium may have a Vickers hardness lower than that of the workpiece.

According to a third aspect, in the processing apparatus of the first aspect or the second aspect, the polishing material may be provided in a tape, and the tape may be supplied to a contact portion between the roller-shaped member and the workpiece.

According to a fourth aspect, in the processing apparatus of any one of the first aspect to the third aspect, both the polishing material and the light scattering medium may be particulates, and a size of the polishing material may be smaller than a size of the light scattering medium.

According to a fifth aspect, in the processing apparatus of any one of the first aspect to the fourth aspect, the light scattering medium may have a polyhedral shape having a number of surfaces equal to or more than those of a tetrahedron, or a spheroidal shape.

According to a sixth aspect, in the processing apparatus of any one of the first aspect to the fifth aspect, the light scattering medium may indicate transmittance within a range from 80% to less than 100% with respect to at least one light wavelength within a range from 150 nm to 400 nm.

According to a seventh aspect, the processing apparatus of any one of the first aspect to the sixth aspect may further include a horizontal driving section that causes the roller-shaped member and the rotary table to move relatively in directions respectively perpendicular to the rotary axis of the rotary table and the rotary axis of the roller-shaped member.

According to an eighth aspect, in the processing apparatus of any one of the first aspect to the seventh aspect, the light scattering medium may include no photocatalyst.

According to a ninth aspect, in the processing apparatus of the first aspect, the light scattering medium may be an air bubble.

According to a tenth aspect, the processing apparatus of the ninth aspect may further include a supply port that supplies ozone water or hydrogen peroxide water, and the air bubble may be generated by irradiating the ozone water or the hydrogen peroxide water with an ultraviolet ray from the ultraviolet ray irradiation source.

According to an eleventh aspect, in the processing apparatus of the tenth aspect, the ultraviolet ray irradiation source may perform irradiation of an ultraviolet ray having a first wavelength which is absorbed into the ozone water or the hydrogen peroxide water and a second wavelength which is absorbed into the workpiece.

According to a twelfth aspect, in the processing apparatus of the eleventh aspect, a peak wavelength of the first wavelength may be 253 nm and a peak wavelength of the second wavelength may be 365 nm.

According to a thirteenth aspect, in the processing apparatus of the twelfth aspect, the ultraviolet ray irradiation source may also include a filter which removes wavelengths equal to or shorter than 100 nm and equal to or longer than 400 nm.

According to a fourteenth aspect, there is provided a processing method of performing processing of a workpiece by using the processing apparatus of any one of the first aspect to the thirteenth aspect.

Hereinafter, the processing apparatus according to embodiments will be described with reference to the accompanying drawings. In the drawings, the same reference numerals and signs are applied to substantially the same members.

Embodiment 1

FIG. 1 is a schematic perspective view illustrating a configuration of processing apparatus 101 used in the present embodiment. Processing apparatus 101 disclosed in FIG. 1 has rotary table 201 which causes workpiece 301 to rotate around the rotary axis (Y-axis), straight-moving driving section (horizontal driving section) 202 which drives workpiece 301 to move straight in an X-axis direction, roller-shaped member 302, and Y-axis direction driving section (vertical driving section) 203 which drives roller-shaped member 302 toward workpiece 301 in a Y-axis direction and performs contact pressurization. Moreover, processing apparatus 101 has Z-axis direction driving section 204 which drives roller-shaped member 302 in a Z-axis direction. Roller-shaped member 302 is driven in the Y-axis direction on Y-axis direction driving section 203 by table driving unit 205 fixed onto Y-axis direction driving section 203. Roller-shaped member 302 comes into contact with workpiece 301 by pressurizing force set in pressurizing force control unit 206. Roller-shaped member 302 rotates fiducially around the central axis (Z-axis). The rotary axis of roller-shaped member 302 is a direction orthogonal to the rotary axis of rotary table 201. In the present embodiment, the rotary axis of roller-shaped member 302 coincides with the Z-axis. Moreover, processing apparatus 101 includes ultraviolet ray irradiation unit (ultraviolet ray irradiation source) 207 which irradiates a portion between roller-shaped member 302 and workpiece 301 with an ultraviolet ray, abrasive grain 402 which is the polishing material supplied to the portion between roller-shaped member 302 and workpiece 301, and light scattering medium 501 which is supplied to the portion between roller-shaped member 302 and workpiece 301 and scatters an ultraviolet ray from ultraviolet ray irradiation unit 207.

Operation and Effect

Figure 4A:
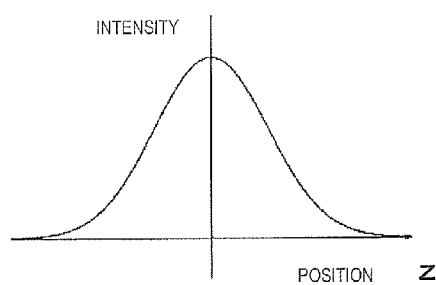
FIG. 4A is a graph illustrating an intensity distribution in a z-direction of an irradiation ultraviolet ray from an ultraviolet ray irradiation unit.

Processing apparatus 101 according to Embodiment 1 disclosed herein adopts a processing mechanism in which workpiece 301 is irradiated with an ultraviolet ray so as to cause a radical which is a strong oxidizing agent to react on the external surface of workpiece 301, oxides softer than workpiece 301 are formed on the external surface of workpiece 301, and the oxides are removed. In order to realize the above-described processing mechanism, processing apparatus 101 is provided with ultraviolet ray irradiation unit 207. However, for example, an irradiation ultraviolet ray from ultraviolet ray irradiation unit 207 has an intensity distribution which is strong at the center and weak on the periphery, as illustrated in FIG. 4A. Therefore, even though irradiation is performed without change along the border line at which workpiece 301 and roller-shaped member 302 come into contact with each other, a fluctuation in the intensity of an ultraviolet ray occurs in the border line. Accordingly, in response thereto, a fluctuation also occurs in the generation quantity of the radical which is the strong oxidizing agent generated by irradiation of an ultraviolet ray. There is a correlation between the generation quantity of the radical and the generation quantity of the oxides. Therefore, as a result, oxides are not uniformly formed at a border portion where workpiece 301 and roller-shaped member 302 come into contact with each other. Consequently, the inventor has found that there is a problem in that a processing and removing amount does not become uniform and a smooth surface cannot be obtained.

Figure 4B:
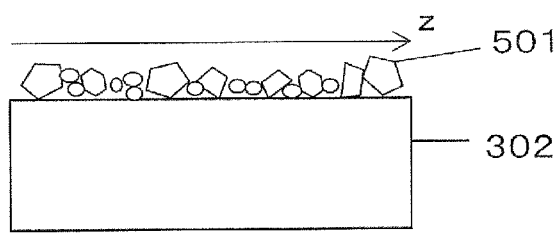
FIG. 4B is a schematic view illustrating a relationship between a light scattering medium receiving an ultraviolet ray and an arrangement position of the roller-shaped member in the z-direction.
Figure 4C:
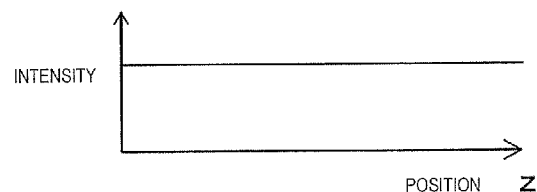
FIG. 4C is a graph illustrating the intensity distribution in the z-direction of an ultraviolet ray with which irradiates the contact portion between the workpiece and the roller-shaped member after the ultraviolet ray is scattered by the light scattering medium in FIG. 4B.

In contrast, the inventor has found the fact described below and has thereby realized the configuration of processing apparatus 101 disclosed herein. If light scattering medium 501 is applied to the contact portion where workpiece 301 and roller-shaped member 302 come into contact with each other and the ultraviolet ray irradiation unit 207 is irradiated, an ultraviolet ray becomes scattered light. Therefore, as illustrated in FIG. 4C, it is possible to irradiate the contact portion between workpiece 301 and roller-shaped member 302 with an ultraviolet ray having average intensity. Accordingly, oxides can be uniformly formed on workpiece 301. As a result thereof, the uniformly distributed oxides are uniformly processed and removed from the top of workpiece 301. Thus, it is possible to form a state of a mirror surface of which irregularity of the external surface is equal to or less than Ra 1 nm.

According to processing apparatus 101, the contact portion between roller-shaped member 302 and workpiece 301 is irradiated with an ultraviolet ray from ultraviolet ray irradiation unit 207, and the ultraviolet ray is scattered by light scattering medium 501. Accordingly, the intensity of an ultraviolet ray becomes uniform along the contact portion between roller-shaped member 302 and workpiece 301. As a result thereof, a layer (film) of uniform oxides is formed due to irradiation of a uniform ultraviolet ray onto the external surface of workpiece 301. It is possible to more uniformly process the external surface of workpiece 301 compared to that in the related art by polishing the uniformly formed oxide film.

Hereinafter, each of members configuring processing apparatus 101 will be described.

Roller-Shaped Member

Roller-shaped member 302 is connected to Y-axis direction driving section (vertical driving section) 203. Roller-shaped member 302 moves in the Y-axis direction by Y-axis direction driving section 203. If roller-shaped member 302 comes into contact with a processing target surface of workpiece 301, the contact portion therebetween is in a line contact state. It is easy to perform irradiation of a uniform ultraviolet ray which is unlikely to be performed in a case of surface contact, with respect to the contact portion between workpiece 301 and roller-shaped member 302 by causing workpiece 301 and roller-shaped member 302 to be in line contact with each other. The entire surface of workpiece 301 can be processed by respectively controlling straight-moving driving section (horizontal driving section) 202 which drives workpiece 301 so as to move straight in the X-axis direction and rotary table 201 which causes workpiece 301 to rotate around the Y-axis.

As described above, the contact portion between workpiece 301 and roller-shaped member 302 in FIG. 1 is in a linear state. In order to suppress the fluctuation in the relative speed between workpiece 301 and roller-shaped member 302 inside the linear contact portion to be equal to or less than 10%, for example, driving sections 201 and 202 of processing apparatus 101 are driven so as to cause a relative speed difference generated when being driven by straight-moving driving section 202 to be greater than a relative speed difference generated in rotary table 201 of processing apparatus 101. For example, the relative speed difference between both ends of the linear contact portion is set to be equal to or less than 10%. For example, due to rotations made by rotary table 201, speed vectors of both the ends are in directions opposite to each other when viewed from the rotary center. Accordingly, the relative speed difference becomes significant. Therefore, rotations made by rotary table 201 are suppressed so as to suppress the relative speed difference between both the ends. Meanwhile, for example, as indicated by the arrows in FIG. 3, driving in the X-axis direction is performed by straight-moving driving section 202 so that the relative speed difference between both the ends can be suppressed so as to be equal to or less than 10%. In addition, workpiece 301 is moved in the X-axis direction by straight-moving driving section 202. Accordingly, light scattering mediums 501 can be gathered in the contact portion between roller-shaped member 302 and workpiece 301. The expression "linear state" denotes a flat surface shape having a longitudinal direction and a short direction orthogonal thereto.

Polishing Material

As the polishing material, for example, abrasive grain 402 having the size equal to or smaller than 10 μm is employed. If abrasive grain 402 becomes large, when abrasive grains 402 close to each other on tape 401 come into contact with workpiece 301, a gap between a portion in contact with workpiece 301 and a portion not in contact therewith in abrasive grains 402 becomes large. Therefore, as abrasive grain 402 becomes larger, the region where abrasive grain 402 is not in contact with workpiece 301 becomes wider. In addition, in a case where processing is performed by using the same pressurizing force, if the abrasive grain is large, a removing amount which is an amount of workpiece 301 removed by abrasive grain 402 becomes greater, and the unprocessed region becomes widened. Accordingly, irregularity of the external surface of workpiece 301 increases. Therefore, there is a need to set the size of abrasive grain 402 to be at least equal to or smaller than 10 μm. If the size of abrasive grain 402 is greater than 10 μm, it is extremely difficult to process a uniform flat surface.

As abrasive grain 402 which is the polishing material, a substance having hardness the same as or greater than that of workpiece 301 is adopted. For example, it is possible to adopt silicon carbide (SiC), GaN, sapphire, diamond, and the like.

Tape

Figure 2:
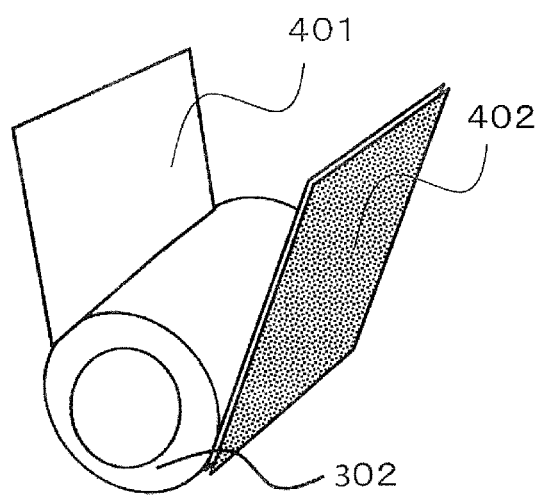
FIG. 2 is a partially enlarged view illustrating a configuration of a roller-shaped member in FIG. 1.

FIG. 2 is a partially enlarged view illustrating a configuration of roller-shaped member 302 in FIG. 1. Abrasive grain 402 which is the polishing material is fixed onto tape 401 by using an adhesive, and roller-shaped member 302 and tape 401 are arranged so as to come into contact with each other. According to the configuration, new tape 401 can be supplied to a portion between workpiece 301 and roller-shaped member 302 at all times. Thus, it is possible to prevent degradation of processing efficiency caused by dulling of abrasive grain 402 while processing is in progress. Tape 401 moves as indicated by the arrows in FIG. 3. Roller-shaped member 302 rotates as much as the movement amount of tape 401. Winding of tape 401 is performed by tape driving unit 205 in FIG. 1. In FIG. 1, tape 401 is not illustrated.

Figure 3:
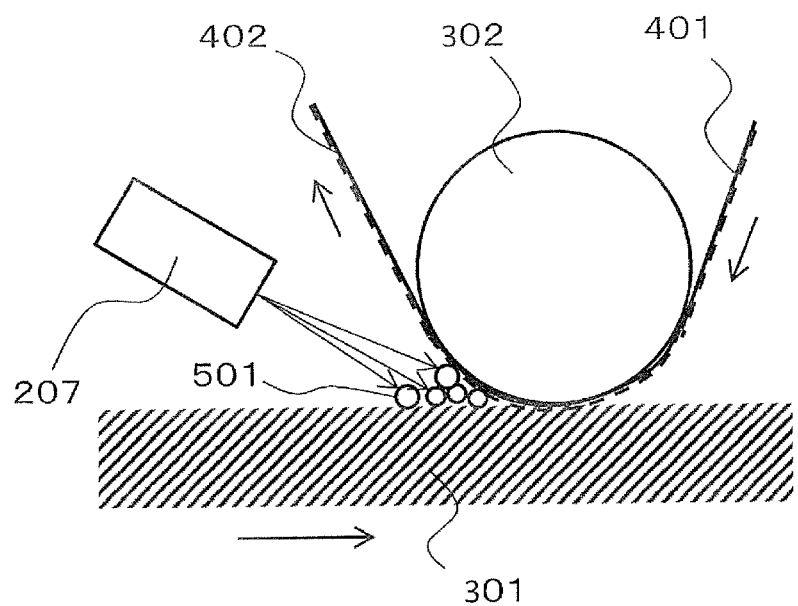
FIG. 3 is an enlarged side view illustrating a state of a contact portion between the roller-shaped member and a workpiece in the processing apparatus in FIG. 1.

FIG. 3 is an enlarged side view illustrating a state of the contact portion between roller-shaped member 302 and workpiece 301 in processing apparatus 101 in FIG. 1. Applied light scattering mediums 501 are gathered in the contact portion between tape 401 and workpiece 301 by each of driving sections 201, 202, and 203. Light emitted from ultraviolet ray irradiation unit 207 is subjected to irradiation onto a surface where roller-shaped member 302 and workpiece 301 come into contact with each other. Here, when A stands for the hardness of workpiece 301, B stands for the hardness of abrasive grain 402, and C stands for the hardness of light scattering medium 501, the materials of abrasive grain 402 and light scattering medium 501 are selected so as to cause the following relational expression to come into existence. In other words, hardness B of abrasive grain 402 is equal to or greater than hardness A of workpiece 301, and hardness C of light scattering medium 501 is less than hardness A of workpiece 301.

$$B \geq A > C$$

In a case where hardness C of light scattering medium 501 is greater than hardness A of workpiece 301, workpiece 301 is processed by light scattering medium 501 while processing is performed, there are cases where a smoothly processed surface cannot be realized. The state where light scattering medium 501 processes workpiece 301 denotes a state where workpiece 301 is processed in a state where plurality of light scattering mediums 501 are gathered and condensed between workpiece 301 and tape 401. In such a state, it is not possible to control a place to be processed, and it is difficult to stabilize the pressure to workpiece 301. Therefore, a place having a deep processing trace and a place having no processing trace are generated. As a result, irregularity occurs on the external surface of workpiece 301. In a case where workpiece 301 is applied to a semiconductor device, the required external surface roughness Ra is a state of a mirror surface equal to or less than 1 nm. However, the state cannot be realized.

Meanwhile, in a case where hardness B of abrasive grain 402 is less than hardness A of workpiece 301, it is not possible to remove workpiece 301 by abrasive grain 402 through a mechanical and physical phenomenon. In addition, even though the pressurizing force is increased so as to process workpiece 301 in such a state, abrasive grain 402 cannot remove the oxides on the external surface of workpiece 301 through a mechanical and physical phenomenon. Accordingly, only the pressurizing force to workpiece 301 is increased, that is, force in a Y-axis negative direction is increased so that workpiece 301 is no longer able to bear the weight. As a result thereof, a problem such as an occurrence of a crack is caused, and thus, workpiece 301 is no longer suitable for a product.

Ultraviolet Ray Irradiation Unit

In order to regularly maintain the relative distance with respect to roller-shaped member 302 at all times, ultraviolet ray irradiation unit 207 is fixed to Z-axis direction driving section 204. The wavelength of an ultraviolet ray subjected to irradiation from ultraviolet ray irradiation unit 207 can employ 365 nm, for example. However, without being limited thereto, the wavelength thereof may be a wavelength shorter than an absorption edge wavelength calculated based on a bandgap, a Planck's constant, and a light speed of workpiece 301. There is a relationship of the absorption edge wavelength $\lambda[\mu m]=h \cdot c/E=1.24/E$. Here, h is a Planck's constant, c is a light speed, and E is a bandgap. In addition, for example, as illustrated in FIG. 4A, the ultraviolet ray subjected to irradiation from ultraviolet ray irradiation unit 207 may have an intensity distribution throughout a regular wavelength range including the above-referenced wavelength.

Light Scattering Medium Applying Unit

Light scattering medium applying unit 208 applying light scattering medium 501 is provided between ultraviolet ray irradiation unit 207 and roller-shaped member 302. According to light scattering medium applying unit 208, light scattering medium 501 can be applied onto workpiece 301. For example, as illustrated in FIGS. 3 and 4B, light scattering medium 501 may be applied along the Z-axis of the contact portion between roller-shaped member 302 and the workpiece 301.

Light Scattering Medium

Light scattering medium 501 is supplied to the contact portion between workpiece 301 and roller-shaped member 302. Light scattering medium 501 receives an ultraviolet ray having an intensity distribution, and the ultraviolet ray is scattered, thereby uniformly irradiating workpiece 301 with the ultraviolet ray. The configuration and the operation of light scattering medium 501 will be described.

The size of light scattering medium 501 is set to be equal to or smaller than 10 mm. Unless the scattering effect of an ultraviolet ray is generated as close as possible to a processing point, the ultraviolet ray effect is reduced. If the size of the light scattering medium is greater than 10 mm, light reaching the processing point is drastically reduced.

In addition, light scattering medium 501 having a size greater than abrasive grain 402 which is the polishing material is selected. If light scattering medium 501 is smaller than abrasive grain 402, there is a possibility that light scattering medium 501 enters the contact portion between workpiece 301 and tape 401. Therefore, the selection is made in order to prevent the possibility thereof. If light scattering medium 501 enters the contact portion between workpiece 301 and tape 401, there are cases where an irregularity shape is formed on the external surface of workpiece 301.

The particle shape of light scattering medium 501 is a polyhedral shape having surfaces equal to or more than those of a tetrahedron, or a spheroidal shape. If the particle shape of light scattering medium 501 has surfaces equal to or less than those of a trihedron, when light scattering medium 501 is caused to roll at a speed difference of workpiece 301 and tape 401 in a case of processing workpiece 301, light scattering medium 501 rolls irregularly, and thus, plurality of light scattering mediums 501 are condensed between workpiece 301 and tape 401. Condensed light scattering mediums 501 enter an adhesion layer on the external surface of tape 401, thereby causing a state where the protruding amount of light scattering medium 501 becomes greater than the protruding amount of abrasive grain 402 from the adhesion layer of the tape. When tape 401 is fed, light scattering medium 501 is carried to the portion between workpiece 301 and tape 401. When light scattering medium 501 enters between tape 401 and workpiece 301, the portion is not processed. Therefore, an unprocessed region is present on workpiece 301. Accordingly, a processed region and an unprocessed region are generated. As a result, irregularity occurs on the external surface. In addition, light scattering medium 501 needs to be formed from a material transmitting an ultraviolet ray and to cause the traveling direction of the ultraviolet ray to be randomly dispersed when the ultraviolet ray is transmitted through the inside of light scattering medium 501. Therefore, it is preferable to have many surfaces, and it is most preferable to have a spherical shape.

In addition, light scattering medium 501 adopts a material having the transmittance equal to or greater than 80% in at least one light wavelength with respect to the wavelength equal to or shorter than 400 nm. If light scattering medium 501 having the transmittance of light less than 80% in the wavelength equal to or shorter than 400 nm is adopted, equal to or more than 20% of ultraviolet light reaching workpiece 301 is absorbed into the light scattering medium. Therefore, there is a need to cause the irradiation position of ultraviolet ray irradiation unit 207 to be close to the border portion between workpiece 301 intended to be irradiated and abrasive grain 402, or there is a need to raise irradiation power of the ultraviolet ray. If the irradiation position of ultraviolet ray irradiation unit 207 is caused to be close thereto or the irradiation power of the ultraviolet ray is raised, tape 401 generates heat, thereby resulting in deformation caused by the heat. In order to prevent deformation caused by heat, there is a need to raise the winding speed of tape 401. However, if the winding speed is raised, the amount of tape 401 used in processing performed once increases, and there is a need to increase the size of the winding motor. Thus, the configuration of the apparatus becomes complicated.

Light scattering medium 501 adopts a material having the maximum value of the transmittance in a wavelength equal to or longer than 150 nm is greater than the maximum value of the transmittance in a wavelength shorter than 150 nm. If a material having the transmittance which becomes the maximum in a wavelength equal to or shorter than 150 nm is adopted, an amount of absorbing ultraviolet light of which the wavelength is longer than 150 nm becomes significant. Therefore, deterioration of the material is accelerated, and thus, there is a need to cause the irradiation position thereof to be close to the border portion between workpiece 301 and abrasive grain 402 or to raise irradiation power of an ultraviolet ray. In such a case as well, in order to prevent the influence of heat, the configuration of the apparatus becomes complicated.

For example, light scattering medium 501 may be supplied by being dispersed in processing liquid, as a particulate solid matter. Otherwise, light scattering medium 501 may be supplied separately from the processing liquid. For example, as described below, light scattering medium 501 may be supplied by being fixed to the tape or the like. In addition, light scattering medium 501 may conduct a function of discharging scraps during processing. The processing liquid may also be supplied from light scattering medium applying unit 208. Light scattering medium 501 may be an air bubble. When an air bubble is adopted as light scattering medium 501, compared to a case of using a solid such as quartz and acryl, there is an effect in which processing can be executed without being influenced by light scattering medium 501 adhering to processing apparatus 101 or workpiece 301. Meanwhile, when a solid such as quartz and acryl is used as light scattering medium 501, since light scattering medium 501 is present when driving workpiece 301, the processing liquid is in turbulence. Therefore, it is possible to achieve an effect in which the function of discharging scraps during processing can be exhibited further.

In a case where an air bubble is adopted as light scattering medium 501, ozone water or hydrogen peroxide water 303 is supplied from light scattering medium applying unit 208 (supply port), and light scattering medium 501 in an air bubble state is generated by an irradiation ultraviolet ray from ultraviolet ray irradiation unit 207. An ultraviolet ray having the first wavelength absorbed into ozone water or hydrogen peroxide water 303 and the second wavelength absorbed into workpiece 301 is subjected to irradiation from ultraviolet ray irradiation unit 207. It is preferable that the peak of the first wavelength is approximately 253 nm and the peak of the second wavelength is approximately 365 nm. When the wavelengths of an ultraviolet ray subjected to irradiation from ultraviolet ray irradiation unit 207 are selected in such a manner, the first wavelength is absorbed into ozone water or hydrogen peroxide water 303. Accordingly, it is possible to generate an air bubble of oxygen or air due to decomposition of ozone or decomposition of hydrogen peroxide. The absorbed first wavelength generates an air bubble, and the second wavelength becomes scattered light due to the air bubble, thereby reaching workpiece 301.

In this case, in ultraviolet ray irradiation unit 207, ultraviolet ray irradiation unit 207 may perform irradiation of an ultraviolet ray through the filter removing a wavelength equal to or longer than 400 nm and a wavelength equal to or shorter than 100 nm. When the wavelength equal to or longer than 400 nm is removed, it is possible to reduce heat caused by absorbing the wavelength equal to or longer than 400 nm and generated by roller-shaped member 302. In addition, when an ultrashort wavelength component equal to or shorter than 100 nm is removed, it is possible to reduce deterioration of roller-shaped member 302 caused by absorbing the wavelength equal to or shorter than 100 nm. The ultraviolet ray which has been transmitted through the filter can be used for absorbing the wavelength into ozone water or hydrogen peroxide water 303 and absorbing the wavelength into workpiece 301. As a result thereof, it is possible to utilize an air bubble as light scattering medium 501, to irradiate workpiece 301 with uniform light, and to execute processing in which the influence of heat from roller-shaped member 302 and the influence of deterioration to the members are reduced.

Figure 5:
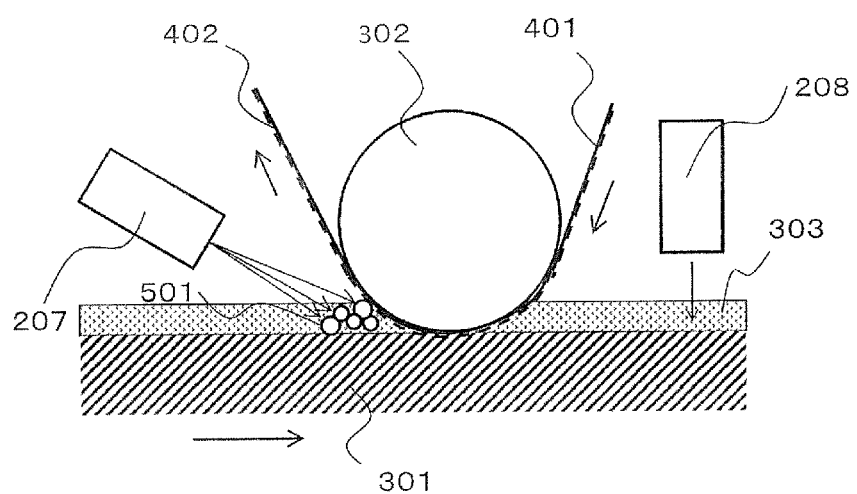
FIG. 5 is an enlarged side view illustrating a state of the contact portion between the roller-shaped member and the workpiece when an air bubble is applied as the light scattering medium in the processing apparatus in FIG. 1.

FIG. 5 illustrates a state where ozone water or hydrogen peroxide water 303 is supplied. The ozone water or hydrogen peroxide water 303 dropped from light scattering medium applying unit 208 is spread on substrate 301 and is supplied to the processing section. Processing is executed while generating light scattering medium 501, that is, an air bubble by the irradiation ultraviolet ray from ultraviolet ray irradiation unit 207.

It is favorable that the size of light scattering medium 501 is greater than that of abrasive grain 402. If light scattering medium 501 is smaller than abrasive grain 402, light scattering medium 501 enters between workpiece 301 and tape 401, and scraps generated during processing cannot be successfully discharged due to the absence of liquid. Accordingly, the processed surface is sometimes reprocessed by the scraps. As a method of specifying light scattering medium 501, light scattering medium 501 is observed by using a microscope and measurement is performed by performing image processing of the result thereof as image data. More specifically, the diameter of a circle having the same area as that of an air bubble (light scattering medium 501) included in the image data is calculated as an equivalent diameter of the air bubble, and the average value of the equivalent diameters of a plurality of the air bubbles included in the same image data is measured as the size of the air bubble. The size of the abrasive grain is measured by a method defined in ISO 8486-1 or ISO 8486-2. Light scattering medium 501 may conduct a function of discharging scraps during processing. The processing liquid may also be supplied from light scattering medium applying unit 208.

As light scattering medium 501, for example, quartz, synthetic quartz, or ultraviolet-ray transmission acryl can be used. In such a manner, it is possible to realize highly precise processing by adopting the above-referenced structure body or an air bubble as light scattering medium 501, without using an expensive member, for example, a photocatalyst such as titanium oxide. Light scattering medium 501 includes no photocatalyst such as titanium.

As described above, according to processing apparatus 101 of Embodiment 1 disclosed herein, it is possible to perform polishing at a high processing speed so as to have a uniform external surface with respect to a GaN substrate which is a next generation semiconductor material. Workpiece 301 is not limited to GaN. For example, sapphire, SiC, diamond, $Ga_2O_3$ may be adopted. In other words, processing apparatus 101 disclosed herein is useful for processing a hard brittle material such as silicon carbide (SiC), GaN, sapphire, and diamond.

In addition, roller-shaped member 302 and workpiece 301 may be arranged so as to relatively move.

In Embodiment 1 disclosed herein, abrasive grains 402 which are the polishing materials are fixed to tape 401. However, without being limited thereto, abrasive grains 402 may be directly fixed to the external surface of roller-shaped member 302 without adopting tape 401.

The operation of each configuration of processing apparatus 101 described above is controlled by executing a predetermined program which is programmed in a controller including a processor. A predetermined program is stored in a memory included in the controller.

Example 1

In Example 1 according to the present embodiment, as workpiece 301 in FIG. 1, a 2-inch GaN wafer fixed to an SUS material by using heat-melting wax is used. The SUS material is fixed onto rotary table 201 by performing pin-pressing. The position of pin-pressing is adjusted so as to cause the positional deviation between the rotary center of rotary table 201 and the rotary center of the 2-inch GaN wafer to be equal to or less than 2 μm. As table driving unit 205, a unit in which the winding speed of the tape can be set to a range from 0.1 mm/min to 5 mm/min is used.

In addition, as tape 401, a tape in which abrasive grains 402 of diamond having the particle diameters within a range from 0.5 μm to 2 μm are dispersed as the abrasive grains on the adhesion layer on a PET tape base agent is used. As pressurizing force control unit 206, an air cylinder which controls pressurizing force by using air pressure is adopted. The setting air pressure is set to a range from 0.1 MPa to 0.6 MPa.

In addition, in ultraviolet ray irradiation unit 207, a filter is selected so as to output an ultraviolet ray of 365 nm from a mercury light source, and an adjustment is performed so that an amount of light of 2,000 mW/cm² is output from the fiber tip at a distance of approximately 10 mm. The tip portion of ultraviolet ray irradiation unit 207 is fixed so as to cause the distance between ultraviolet ray irradiation unit 207 and the contact point of the GaN wafer and the tape to be 20 mm.

As light scattering medium 501, a compound in which hydrogen peroxide water having density of 30% is mixed with synthetic quartz particles having the particle diameters of 5 μm at a rate of 10 g per 100 ml is used.

Here, regarding the Vickers hardness of abrasive grain 402, workpiece 301, and light scattering medium 501, diamond used as abrasive grain 402 is approximately 70 GPa, the GaN material of workpiece 301 is 20 GPa, and the synthetic quartz of light scattering medium 501 is 9.7 GPa. In other words, each of the materials is selected so as to satisfy the relationship of the abrasive grain>the workpiece>the light scattering medium in hardness.

The external surface of workpiece 301 which is the GaN wafer is processed in advance by using the abrasive grains of diamond having the particle size #1000 so as to obtain the external surface roughness Ra of 5 nm. Roller-shaped member 302 adopts urethane rubber having shore hardness of 95 which is rebound hardness. As roller-shaped member 302, a roller having the length of two inches in the longitudinal direction and the outer diameter of one inch is used.

In addition, when performing processing, the pressurizing force of pressurizing force control unit 206 is set to 0.4 MPa, and the processing is performed at a position where Y-axis direction driving section 203 is moved from a zero point in the Y-axis negative direction by 100 μm while causing a position where workpiece 301 and tape 401 including the diamond abrasive grains come into contact with each other to be the zero point.

Light scattering medium 501 which is the particle of synthetic quartz employs a medium manufactured by performing polishing on a both-side polishing machine for approximately 20 minutes after the synthetic quartz is crushed so as to have surfaces equal to or more than those of a tetrahedron. An amount of 10 cc per minute of light scattering medium 501 which is the synthetic quartz is dropped onto workpiece 301 from light scattering medium applying unit 208.

As the driving region of straight-moving driving section 202, the driving condition is set so that straight-moving driving section 202 reciprocates 1,000 times per minute within a range of 2.5 mm to the positive side and 2.5 mm to the negative side while having the rotary center of rotary table 201 as the position of X=0. The driving condition is set so that rotary table 201 rotates at a speed of 2.5 rotations/min. Under the above-referenced condition, the relative speed of straight-moving driving section 202 is 5,000 mm/min. The relative speed of rotary table 201 has a difference of 392.5 mm/min at the maximum due to the adopted 2-inch GaN, while having the rotary center as zero point. There is a speed difference of 9.2% in the added relative speed of straight-moving driving section 202 and rotary table 201.

Processing is performed under the above-referenced condition, and times taken for reaching the target external surface roughness Ra 1 nm or less respectively in a case where irradiation of an ultraviolet ray is performed and a case where irradiation of an ultraviolet ray is not performed are measured. Table 1 shows the measured results.

TABLE 1

|  | 0 min | 10 min | 20 min | 30 min | 40 min | 50 min | 60 min |
| --- | --- | --- | --- | --- | --- | --- | --- |
| No UV Ray | Ra 5.7 nm | Ra 2.7 nm | Ra 1.8 nm | Ra 1.5 nm | Ra 1.3 nm | Ra 1.1 nm | Ra 0.9 nm |
| With UV Ray | Ra 5.7 nm | Ra 0.9 nm | — | — | — | — | — |

In Table 1, the horizontal axis indicates the processing time, the upper row in the vertical axis indicates the case where irradiation of an ultraviolet ray is not performed, and the lower row indicates the case where irradiation of an ultraviolet ray is performed. The external surface roughness (Ra) is measured by using a white interferometer. In the case where irradiation of an ultraviolet ray is not performed, it requires approximately 60 minutes until the external surface roughness reaches Ra 1 nm or less. Meanwhile, in the case where irradiation of an ultraviolet ray is performed, the external surface roughness reaches Ra 1 nm or less after 10 minutes. Accordingly, it is possible to achieve at least six times the improvement of the processing speed in the case where irradiation of an ultraviolet ray is performed, compared to the case where irradiation of an ultraviolet ray is not performed.

Subsequently, in order to verify the effect of light scattering medium 501, only straight-moving driving section 202 is driven while rotary table 201 in FIG. 1 is not driven, and processing is performed in a case of applying the light scattering medium and a case of not applying the light scattering medium. Processing is executed under the same conditions excluding driving of rotary table 201. Irradiation of ultraviolet light is performed so that the center of spreading ultraviolet light comes to a zero point while having the center of roller-shaped member 302 in the longitudinal direction as the zero point. Table 2 shows the measured results.

TABLE 2

|  | −5 mm | −3 mm | 0 mm | 3 mm | 5 mm |
| --- | --- | --- | --- | --- | --- |
| No Light Scattering Medium | Ra 2.0 nm | Ra 1.2 nm | Ra 0.8 nm | Ra 1.1 nm | Ra 1.7 nm |
| With Light Scattering Medium | Ra 0.9 nm | Ra 0.9 nm | Ra 0.9 nm | Ra 0.9 nm | Ra 0.9 nm |

According to the results of Table 2, in the case of no light scattering medium, as the distance is elongated from the zero point in the longitudinal direction of roller-shaped member 302, the external surface roughness of the processed surface becomes worse, thereby resulting in a difference of the processing rate. Meanwhile, in the case of applying light scattering medium 501, there is no difference of the external surface roughness depending on the place, and thus, it is possible to perform processing at a uniform processing rate.

The processing apparatus disclosed herein can be applied to processing of a hard brittle material such as silicon carbide (SiC), GaN, sapphire, diamond.

What is claimed is:

1. A processing apparatus comprising;
   a rotary table that causes a workpiece to rotate around a rotary axis;
   a roller-shaped member that rotates on an axis orthogonal to the rotary axis of the rotary table;
   a vertical driving section that is driven in a direction of the rotary axis of the rotary table to bring the roller-shaped member and the workpiece into contact with each other;
   an ultraviolet ray irradiation source that irradiates a portion between the roller-shaped member and the workpiece with an ultraviolet ray;
   a polishing material that is supplied to the portion between the roller-shaped member and the workpiece;
   a light scattering medium that is supplied to the portion between the roller-shaped member and the workpiece to scatter the ultraviolet ray from the ultraviolet ray irradiation source; and
   a supply port that supplies ozone water or hydrogen peroxide water,
   wherein the light scattering medium is an air bubble generated by irradiating the ozone water or the hydrogen peroxide water with the ultraviolet ray from the ultraviolet ray irradiation source.

2. The processing apparatus of claim 1,
   wherein the polishing material has a Vickers hardness higher than that of the workpiece, and the light scattering medium has a Vickers hardness lower than that of the workpiece.

3. The processing apparatus of claim 1,
   wherein the polishing material is provided in a tape, and
   wherein the tape is supplied to a contact portion between the roller-shaped member and the workpiece.

4. The processing apparatus of claim 1,
   wherein both the polishing material and the light scattering medium are particulates, and
   wherein a size of the polishing material is smaller than a size of the light scattering medium.

5. The processing apparatus of claim 1,
   wherein the light scattering medium has a polyhedral shape having surfaces equal to or more than those of a tetrahedron, or a spheroidal shape.

6. The processing apparatus of claim 1,
   wherein the light scattering medium indicates transmittance within a range from 80% to less than 100% with respect to at least one light wavelength within a range from 150 nm to 400 nm.

7. The processing apparatus of claim 1, further comprising:
   a horizontal driving section that causes the roller-shaped member and the rotary table to relatively move in directions respectively perpendicular to the rotary axis of the rotary table and the rotary axis of the roller-shaped member.

8. The processing apparatus of claim 1,
   wherein the light scattering medium includes no photocatalyst.

9. The processing apparatus of claim 1,
   wherein the ultraviolet ray irradiation source performs irradiation of the ultraviolet ray having a first wavelength which is absorbed into the ozone water or the hydrogen peroxide water and a second wavelength which is absorbed into the workpiece.

10. The processing apparatus of claim 9,
    wherein a peak wavelength of the first wavelength is 253 nm and a peak wavelength of the second wavelength is 365 nm.

11. The processing apparatus of claim 10,
    wherein the ultraviolet ray irradiation source also includes a filter which removes wavelengths equal to or shorter than 100 nm and equal to or longer than 400 nm.

12. A processing method of performing processing of a workpiece by using the processing apparatus of claim 1.

* * * * *